United States Patent [19]

Di Lorenzo et al.

[11] 3,896,479

[45] July 22, 1975

[54] REDUCED STRESSES IN III-V SEMICONDUCTOR DEVICES

[75] Inventors: James Vincent Di Lorenzo, Piscataway; George Arthur Rozgonyi, Chatham, both of N.J.

[73] Assignee: Bell Telephone Laboratories, Incorporated, Murray Hill, N.J.

[22] Filed: Mar. 4, 1974

[21] Appl. No.: 447,547

Related U.S. Application Data

[63] Continuation-in-part of Ser. No. 399,824, Sept. 24, 1973, abandoned.

[52] U.S. Cl. ...................... 357/71; 357/61; 357/65; 357/68; 29/591

[51] Int. Cl. ............................................ H01l 5/00

[58] Field of Search ............ 317/234, 5.3, 5.4, 235, 317/30, 31, 29, 591

[56] References Cited

UNITED STATES PATENTS

| | | | |
|---|---|---|---|
| 3,457,473 | 7/1969 | Okada | 317/234 |
| 3,636,414 | 1/1972 | Kimura | 317/234 |
| 3,642,528 | 2/1972 | Kimura | 317/234 |
| 3,714,521 | 1/1973 | Shaw | 317/234 |

OTHER PUBLICATIONS

IEEE Proceedings — Nov. 1972 — pp. 1448–1449 — Migitaka "Millimeter–Wave GaAs Schottky Barrier Impatt Diodes".

*Primary Examiner*—Michael J. Lynch
*Assistant Examiner*—E. Wojciechowicz
*Attorney, Agent, or Firm*—P. V. D. Wilde

[57] ABSTRACT

Substrate tensile stresses resulting from the combination of an electroplated gold or silver heat sink with a metal contact on III-V semiconductor devices, such as GaAs IMPATT diodes, may be substantially compensated by interposing a layer of tungsten under compressive stress between the contact layer and the heat sink. Since gold or silver is not easily plated on tungsten, a thin layer of platinum is deposited over the tungsten layer prior to forming the heat sink.

10 Claims, 1 Drawing Figure

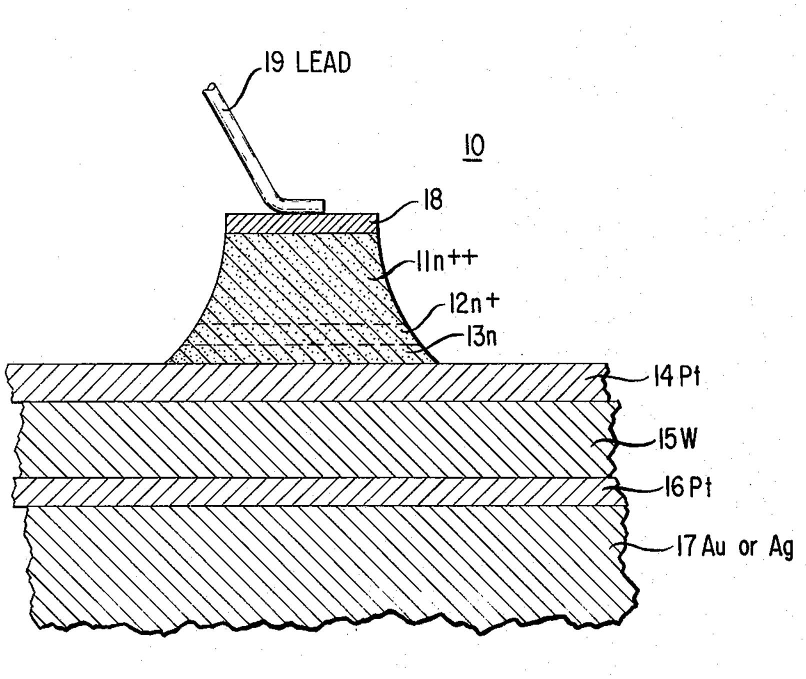
19 LEAD
10
18
11n++
12n+
13n
14 Pt
15 W
16 Pt
17 Au or Ag

REDUCED STRESSES IN III-V SEMICONDUCTOR DEVICES

This is a continuation-in-part of Ser. No. 399,824, filed Sept. 24, 1973, and now abandoned.

BACKGROUND OF THE INVENTION

1. Field of the Invention

The invention is concerned with III-V semiconductor devices, such as gallium arsenide IMPATT diodes, having plated heat sinks formed on metal contact layers, and, more particularly, with reducing tensile stresses caused by the combination of the plated heat sink with the contact layer.

2. Description of the Prior Art

Discrete silicon solid state devices which require low thermal impedance of the dissipation of high input power have usually been fabricated by thermocompression (TC) bonding the device to a heat sink of high thermal conductivity. For example, in a silicon mesa impact avalanche transit-time (IMPATT) diode, in which a Schottky barrier layer contacts an active region, the Schottky barrier is TC bonded to a diamond heat sink. That technology has been extended to the fabrication of III-V compound semiconductor devices, such as GaAs Gunn effect diodes, IMPATT diodes, light emitting diodes (LED), and heterostructure junction lasers. However, the TC bonding processing step has been occasionally found to lead to material degradation, which may adversely affect the electrical performance of such III-V devices.

More recently, an alternate approach to TC bonding in III-V compound semiconductors has employed electroplated heat sinks (PHS). The efficiency and yield of PHS devices are generally considered to be better than TC bonded devices.

Although improvements have been achieved using the PHS technology as applied, for example, to GaAs IMPATT devices, new problems have arisen, due to tensile stresses that are inherent in electroplating gold or silver onto a metal contact, such as a platinum Schottky barrier contact or an ohmic contact. Such stresses cause the GaAs substrate to warp severely. For example, radii of curvature of less than 1 meter have been observed for a 100 micrometer thick PHS on a 250 micrometer thick GaAs substrate.

Such a small radius of curvature is detrimental for the following reasons. After electroplating, the substrate must be thinned by lapping and polishing such that the final thickness of the GaAs substrate ranges from about 10 micrometers to 20 micrometers. During the thinning step, two problems are encountered. First, for example, a 2 centimeter wide substrate, bent to a radius of curvature equal to 1 meter, has been observed to exhibit a center-to-edge deflection of about 25 micrometers. Consequently, since the wafers do not lie flat on the polishing block during the GaAs substrate thinning procedure, the final desired uniform thickness of 10 micrometers to 20 micrometers is difficult to achieve. Second, it has been observed that in most cases the stresses are so severe that the GaAs substrate breaks apart by spontaneously cleaving into several pieces, with a consequent reduction in the yield per wafer.

SUMMARY OF THE INVENTION

In accordance with the invention, substrate tensile stresses resulting from the combination of a metal contact layer and an electroplated gold or silver heat sink layer on a III-V semiconductor device are substantially compensated by interposing a layer of tungsten under compressive stress between the metal contact layer and the electroplated heat sink layer. Since gold or silver is not easily electroplated on tungsten, a thin layer of platinum is deposited over the tungsten layer.

BRIEF DESCRIPTION OF THE DRAWING

The FIGURE shows a sectional view of a device, here an IMPATT diode, fabricated in accordance with the invention.

DETAILED DESCRIPTION OF THE INVENTION

The Drawing is discussed in terms of the preferred embodiment, which is directed to the compensation of stresses in Schottky barrier GaAs mesa IMPATT diodes. However, it is clear that the inventive results obtain over a broad spectrum of III-V semiconductor devices, including Gunn diodes, light emitting diodes, and heterostructure junction lasers. The inventive approach may be used wherever a plated heat sink is combined with a metal contact, whether the contact is a Schottky barrier contact or an ohmic contact.

In the FIGURE is shown an IMPATT diode 10 comprised of a substrate 11 of GaAs having a carrier concentration of about $10^{18}$ $cm^{-3}$, designated $n^{++}$. A second layer 12 of GaAs is then epitaxially formed on the substrate and has a carrier concentration of approximately $4 \times 10^{17}$ $cm^{-3}$, designated $n^{+}$. The $n^{+}$ layer forms a buffer region between the $n^{++}$ substrate (to which ohmic contact is made) and an $n$ layer 13. The $n$ layer, also of GaAs, is epitaxially formed on the surface of layer 12 and has a carrier concentration of about $10^{16}$ $cm^{-3}$. The $n$ layer forms the active region of the device. The epitaxial formations are carried out by methods well known in the art. The thickness of the $n^{+}$ layer is typically about 5 micrometers to 10 micrometers, and the thickness of the $n$ layer is about 5 micrometers to 15 micrometers. During processing, the $n^{++}$ substrate is typically reduced by lapping and polishing using methods well known in the art, such that the final thickness of the substrate is about 10 micrometers to 20 micrometers. Details of this structure and its fabrication may be found in Vol. 59, *Proceedings of the IEEE*, pp. 1212–1215 (1971), and thus do not form a necessary part of this invention.

A metal contact layer 14, here a Schottky barrier, is formed on the surface of the $n$ layer. Platinum is a convenient metal to use as a Schottky barrier and is typically vacuum-sputtered to a thickness of about 0.2 micrometers.

In the prior art, a heat sink is formed on the exposed surface of the Schottky barrier for the purpose of dissipating excessive heat generated during the operation of the device. However, it is observed that the combination of the platinum layer 14 and an electrodeposited heat sink 17 exhibits tensile stress, causing the substrate to warp severely. In accordance with the present invention, a metal layer 15, preferably tungsten, is interposed between the platinum layer and the heat sink. In order to counteract the tensile stress of the platinum layer and the heat sink, the tungsten layer should be formed under compressive stress of a magnitude sufficient to compensate for the tensile stress. The formation of tungsten layers under compressive stress is apparently possible by vacuum sputtering under certain conditions. Other vacuum deposition techniques, such as vacuum evaporation, apparently form tungsten layers in tensile stress.

A number of factors have been observed to affect the magnitude and direction of stresses in tungsten layers deposited by rf diode sputtering. Apparatus for rf sputtering is described in Vol. 8, *Journal of Vacuum Science and Technology*, pp. 512–530 (1971), and thus does not form a necessary part of this invention. These factors include sputtering power, substrate bias, substrate temperature, and argon pressure. Compressive stresses in tungsten layers are obtained at comparatively high sputtering power. A negative bias on the substrate reduces the sputtering power required to deposit tungsten in compressive stress, while a positive bias increases the sputtering power required to deposit tungsten in compressive stress. Higher substrate temperatures reduce the magnitude of the stress. Compressive stress is also favored by lower argon pressures.

The crossover point, or the point at which a change in a sputtering condition effects a change from tungsten layers deposited under tensile stress to tungsten layers deposited under compressive stress is, in general, unique to the particular sputtering apparatus employed and accordingly must be experimentally determined for the particular apparatus. By way of illustration, the following crossover points have been observed for one particular sputtering apparatus. This apparatus consists of a conventional 18 in. diameter glass bell-jar system and associated vacuum equipment. The sputtering power is obtained from a Varian 2.5 kW rf power supply (Model 980–2407). For zero bias applied to the substrate, tungsten layers deposited at a sputtering power greater than about 300 W are under compression. For negative substrate bias equal to or greater in magnitude than −100 V, tungsten layers deposited at a sputtering power greater than about 200 W are under compression. For positive substrate bias, the sputtering power must exceed 350 W in order to obtain tungsten layers under compression. At a sputtering power of 250 W and a substrate temperature of 325°C (zero substrate bias), the crossover point from compressive stress to tensile in tungsten layers occurs at an argon pressure of about 9 millitorrs; at a sputtering power of 600 W and a substrate temperature of about 300°C, the crossover point occurs at an argon pressure of about 18 millitorrs.

The tungsten layer is deposited under compression to a thickness ranging from about 0.1 micrometers to 0.7 micrometers, with higher values associated with thicker heat sinks. Such a range effectively reduces stresses in the substrate caused by the combination of the metal contact layer 14 and the plated heat sink 17. The next step would ordinarily be the electrodeposition of gold or silver to form the plated heat sink. However, since gold or silver do not readily plate onto tungsten, it is preferred to deposit a layer 16 of platinum on the exposed surface of the tungsten layer. This layer should preferably be kept thin in order not to add to the stresses already created by layer 14. The upper thickness limit should not exceed that of the metal contact layer 14, while the lower thickness limit is dictated by the practical limitations of obtaining a continuous, pinhole-free thin layer. Accordingly, a thickness in the range of 0.05 micrometers to 0.2 micrometers may be set for the platinum layer 16. The depositions of the tungsten layer 15 and the thin platinum layer 16 are conveniently sequentially performed in the same vacuum apparatus immediately following the deposition of layer 14. Conventional techniques well known in the art are employed to form the layers to the desired thicknesses.

Finally, the heat sink 17, either of gold or of silver, is plated onto layer 16 to form an electrical and thermal contact to that layer. The electroplating is carried out by using methods well known in the art. Typically, gold is plated to a thickness of about 90 micrometers and lapped to about 75 micrometers, while silver is plated to a thickness of about 150 micrometers and lapped to about 125 micrometers. However, such thicknesses may be further reduced, if necessary to further reduce stresses created by the plated heat sink.

Following reduction of the substrate 11 to the desired thickness by lapping and polishing, as described above, an ohmic contact 18 is formed on the exposed surface of the substrate. There are a variety of ohmic contacts known in the art, any of which may be conveniently used in the practice of the invention. To complete the device. excess gallium arsenide is removed by chemical etching to form the mesa configuration, and a lead 19 is attached to the ohmic contact layer, such as by TC bonding.

EXAMPLE 1

Initially, GaAs substrates were prepared in accordance with the prior art with vacuum-sputtered platinum Schottky barrier layers and electroplated gold or silver heat sinks. For a platinum layer of 0.2 micrometers, the resultant stress was sufficient to bend a GaAs substrate having a thickness of about 250 micrometers to a radius of curvature of $R_{Pt} = +6$ meters, where the plus sign signifies a tensile film stress. As is well known, the radius of curvature is inversely proportional to stress. Gold layers ranging from 75 micrometers to 100 micrometers in thickness exhibited an $R_{Au}$ of less than 1 meter. Since the gold stress was also tensile, the $R_{Pt+Au}$ was reduced further, indicating increased substrate stress. Typically, GaAs substrates prepared in this manner evidenced cracking.

EXAMPLE 2

Subsequently, GaAs substrates were prepared in accordance with the invention. A tungsten layer and a second platinum layer were sequentially vacuum-sputtered in the same rf diode sputtering apparatus as the Schottky barrier layer. The tungsten layer was deposited under compression at a sputtering power of 600 W, zero substrate bias, a substrate temperature of about 300°C, and an argon pressure of 14 millitorrs.

The Table below illustrates the effect of interposing the multilayer structure of tungsten and platinum between the platinum Schottky barrier and the gold or silver heat sink. While the resultant total radius of curvature of samples 1 to 3 ranged from +1.5 meters to +2.8 meters, it can be seen from sample 3′ that thinning the heat sink of sample 3 from 100 micrometers to 52 micrometers results in a significant improvement in the radius of curvature. None of the GaAs substrates prepared in accordance with the invention evidenced cracking.

TABLE

STRESS AND CURVATURE DATA FOR STRESS-COMPENSATED SCHOTTKY BARRIERS

| Sample | Substrate Thickness, Micrometers | Layer | Approximate Layer Thickness, Micrometers | Final Radius of Curvature, Meters |
|---|---|---|---|---|
| 1 | 350 | Pt | 0.2 | |
| | | W | 0.3 | |
| | | Pt | 0.5 | |
| | | Ag | 250.0 | +1.5 |
| 2 | 400 | Pt | 0.2 | |
| | | W | 0.4 | |
| | | Pt | 0.2 | |
| | | Au | 87.0 | +2.8 |
| 3 | 200 | Pt | 0.2 | |
| | | W | 0.4 | |
| | | Pt | 0.2 | |
| | | Ag | 100.0 | +2.0 |
| 3' | 200 | Pt | 0.2 | |
| | | W | 0.4 | |
| | | Pt | 0.2 | |
| | | Ag | 52.0 | +13 to +500 |

Mesa IMPATT diode devices were fabricated from the sample substrates. Typically at X band frequencies (10 GHz to 11 GHz), the efficiency at 10.8 GHz ranged from 11 percent (yielding 1.5 watts output for 13.7 watts input) to 15 percent (for 6.8 watts input). At C band frequencies (4 GHz to 6 GHz), the efficiency of these devices at 5.4 GHz ranged from 10 percent (for 32 watts input) to 11.6 percent (for 18 watts input). The performance of these devices is comparable to prior art platinum Schottky barrier devices with no stress compensation, indicating that devices with the multilayer structure have substantially the same heat dissipation characteristics as prior art devices.

What is claimed is:

1. A method of fabricating a substantially stress-compensated contact on a III-V semiconductor device, the method comprising:

a. forming a metal layer on a III-V semiconductor surface; and b. forming an electroplated heat sink layer of gold or silver over the metal layer, characterized in that prior to forming the heat sink layer, a multilayer structure is formed on the layer, the multilayer structure comprising:

a. a tungsten layer, under compressive stress, formed and deposited on the metal layer by means of rf sputtering, and compensating sufficiently for the stress of the metal layer so that the resultant radius of curvature of the multilayer structure is greater than 5 meters; and b. a thin platinum layer formed on the tungsten layer.

2. The method of claim 1 in which the metal layer is a Schottky barrier contact of platinum.

3. The method of claim 1 in which the metal layer is an ohmic contact.

4. The method of claim 1 in which the semiconductor surface is gallium arsenide.

5. The method of claim 1 in which the tungsten layer ranges from about 0.1 micrometers to about 0.7 micrometers in thickness and in which the thin platinum layer ranges from about 0.05 micrometers to about 0.2 micrometers in thickness.

6. A III-V semiconductor device comprising:

a. a metal layer on a semiconductor surface; and b. a heat sink layer of gold or silver on the metal layer, characterized in that a multilayer structure is interposed between the metal layer and the heat sink layer, the multilayer structure comprising:

a. a tungsten layer, under compressive stress, formed and deposited on the metal layer by means of rf sputtering and compensating sufficiently for the stress of the metal layer so that the resultant radius of curvature is greater than 5 meters; and b. a thin platinum layer formed on the tungsten layer.

7. The device of claim 6 in which the metal layer is a Schottky barrier contact of platinum.

8. The device of claim 7 in which the device is a gallium arsenide IMPATT diode.

9. The device of claim 6 in which the metal layer is an ohmic contact.

10. The device of claim 6 in which the tungsten layer ranges from about 0.1 micrometers to 0.7 micrometers in thickness and in which the thin platinum layer ranges from about 0.05 micrometers to about 0.2 micrometers in thickness.

* * * * *